(12) United States Patent
Carcasi et al.

(10) Patent No.: US 11,339,733 B2
(45) Date of Patent: May 24, 2022

(54) SYSTEMS AND METHODS TO MONITOR PARTICULATE ACCUMULATION FOR BAKE CHAMBER CLEANING

(71) Applicant: Tokyo Electron Limited, Tokyo (JP)

(72) Inventors: Michael Carcasi, Austin, TX (US); Mark Somervell, Austin, TX (US)

(73) Assignee: TOKYO ELECTRON LIMITED, Tokyo (JP)

( * ) Notice: Subject to any disclaimer, the term of this patent is extended or adjusted under 35 U.S.C. 154(b) by 516 days.

(21) Appl. No.: 16/562,844

(22) Filed: Sep. 6, 2019

(65) Prior Publication Data

US 2021/0071607 A1    Mar. 11, 2021

(51) Int. Cl.

| | |
|---|---|
| *F02D 41/02* | (2006.01) |
| *F01N 11/00* | (2006.01) |
| *G03F 7/16* | (2006.01) |
| *G03F 7/40* | (2006.01) |
| *H01L 21/67* | (2006.01) |
| *G01N 29/02* | (2006.01) |
| *H01L 21/768* | (2006.01) |

(52) U.S. Cl.
CPC ............ *F02D 41/029* (2013.01); *F01N 11/00* (2013.01); *G03F 7/168* (2013.01); *G03F 7/40* (2013.01); *H01L 21/67098* (2013.01); *H01L 21/67103* (2013.01); *F01N 2900/04* (2013.01); *G01N 29/022* (2013.01); *H01L 21/67155* (2013.01); *H01L 21/76853* (2013.01)

(58) Field of Classification Search
CPC .......... F02D 41/029; G03F 7/168; G03F 7/00; G03F 7/38; H01L 21/67098; H01L 21/67155; H01L 21/67109; H01L 21/67248; H01L 21/67288; H01L 21/68742; G01N 29/022
See application file for complete search history.

(56) References Cited

U.S. PATENT DOCUMENTS

| | | | |
|---|---|---|---|
| 6,615,679 B1 * | 9/2003 | Knollenberg | G01N 1/2247 73/28.01 |
| 2008/0237214 A1 * | 10/2008 | Scheer | F27B 17/0025 219/439 |
| 2012/0067521 A1 * | 3/2012 | Shimomura | H01L 21/67178 156/345.31 |
| 2014/0273290 A1 * | 9/2014 | Somervell | H01L 21/324 34/90 |

(Continued)

*Primary Examiner* — Francis C Gray
(74) *Attorney, Agent, or Firm* — Slater Matsil, LLP

(57) ABSTRACT

Various embodiments of monitoring systems and methods are disclosed herein to monitor particulate accumulation within a bake chamber configured to thermally treat substrates, and determine when the bake chamber requires cleaning. Embodiments of the disclosed monitoring system may generally include one or more sensors to monitor particulate accumulation on one or more inside surfaces of a bake chamber and/or a bake chamber lid assembly, and a controller, which is coupled to receive a sensor output from the one or more sensors and configured to use the sensor output to determine when cleaning is needed. Various types of sensors including, but not limited to, optical sensors, and surface acoustic wave-based sensors may be used in the present disclosure to monitor particulate accumulation inside the bake chamber.

20 Claims, 8 Drawing Sheets

(56) References Cited

U.S. PATENT DOCUMENTS

| | | | | |
|---|---|---|---|---|
| 2015/0371882 A1* | 12/2015 | Tsai | ........................ | C23C 16/52 |
| | | | | 118/712 |
| 2019/0145874 A1* | 5/2019 | Woolsey | .............. | G01N 1/4022 |
| | | | | 73/863.12 |
| 2020/0176291 A1* | 6/2020 | Rinzan | .............. | C23C 16/45544 |

* cited by examiner

SYSTEMS AND METHODS TO MONITOR PARTICULATE ACCUMULATION FOR BAKE CHAMBER CLEANING

BACKGROUND

The present disclosure relates to the processing of substrates within bake chambers and cleaning requirements associated with such bake chambers.

A photolithography process flow may include various semiconductor bake processes including, e.g., a post application bake (PAB), a post exposure bake (PEB) and/or a post development bake (PDB). These bake processes can be used to thermally treat (i.e., bake) one or more liquid solutions, layers, or films applied to or deposited onto a substrate. Typical films include topcoat (TC) barrier layers, topcoat antireflective (TARC) layers, bottom antireflective coating (BARC) layers, imaging layers such as photoresist (PR) layers, sacrificial layers, and barrier layers such as hard mask layers for etch stopping. During these bake processes, solvent-rich, polymer-containing, layers or films are baked at temperatures close to and potentially well above the boiling point of the casting solvent used. The bake process time and temperature are used to drive out solvents and cure or harden the film, and thereby define the characteristics of the film at exposure and post exposure develop where the circuit feature is defined, prior to etching the feature into the substrate.

During the bake process, sublimation products (solids), out-gassing (liquid) materials and/or other hard material may be deposited or condense on the inside of the bake chamber and/or in the exhaust line. This hard material builds up and creates particulates over time, which eventually shed or peel off the inner surface of the bake chamber (e.g., usually after about 4,000 to 15,000 wafers are processed). The degree of particulate generation generally depends on chemistry and bake temperature.

In some bake chambers, particulates may accumulate on an inner surface of the bake chamber, including the bake chamber lid. Since the bake chamber lid is typically mounted above the substrate, particulates that accumulate on the lid may fall off onto the substrate, causing excursions (i.e., errors) in the bake process that may lead to defects on the substrate. For example, particulates that fall onto the substrate may block etch processes causing electrical "open" or "short" in the subsequently formed integrated circuit. Particulates of lesser size and those falling on critical locations on a device may create perturbations in the active features' critical dimensions, producing adverse or fatal consequences during device operation.

In an effort to mitigate process excursions and minimize defects during substrate processing, the bake chamber and/or the bake chamber lid may be periodically subjected to a preventive maintenance cleaning cycle to clean the particulate build-up on the inside of the bake chamber or bake chamber lid. For example, the interior of the bake chamber and/or the bake chamber lid may be cleaned after a certain number of wafers have been processed in the bake chamber, or after a certain amount of bake process time. In some cases, bake chamber cleaning cycle may involve cooling down the bake chamber, removing the bake chamber lid and cleaning it in various chemicals, including dunking it in a bath of solvent. After cleaning is complete, the bake chamber must be reassembled and tested for process compliance. Although a preventive maintenance cleaning process is helpful in preventing excursions in the bake process and reducing defects on the substrate, it is a time consuming process (e.g., cleaning can take 4 to 6 hours), during which the tool is unusable for manufacturing.

SUMMARY

Systems and methods are disclosed to monitor particulate accumulation within a bake chamber to determine when the bake chamber requires cleaning. One or more sensors associated with the bake chamber are used to monitor this particulate accumulation. The sensors can be positioned inside or outside a processing chamber for the bake chamber. A controller compares sensor data to threshold values and determines if cleaning is required due to particulate accumulation. In one embodiment, the system and method disclosed herein may be utilized when processing semiconductor substrates. As described herein, the automated monitoring and cleaning determinations improve efficiency and reduce costs. Different or additional features, variations, and embodiments can also be implemented, and related systems and methods can be utilized as well.

For one embodiment, a method is disclosed to monitor particulate accumulation within a bake chamber configured to thermally treat substrates and to determine when the bake chamber requires cleaning. The method includes monitoring particulate accumulation on an inside surface of the bake chamber and/or on a bake chamber lid assembly of the bake chamber, comparing the particulate accumulation to a predefined accumulation threshold, and indicating that the bake chamber and/or the bake chamber lid assembly requires cleaning if the particulate accumulation exceeds the predefined accumulation threshold.

In additional embodiments, the monitoring includes detecting or calculating a mass variation per unit area on a surface of a quartz crystal resonator incorporated within the bake chamber and/or the bake chamber lid assembly. In further embodiments, the comparing includes comparing the mass variation per unit area to a predefined mass threshold. In still further embodiments, the method includes determining that the bake chamber and/or the bake chamber lid assembly requires cleaning if the mass variation per unit area exceeds the predefined mass threshold.

In additional embodiments, the monitoring includes capturing digital images of the inside surface of the bake chamber and/or the bake chamber lid assembly, processing the digital images to detect a color change, and equating the color change, or a surface area affected by the color change, to an amount of particulate accumulation. In further embodiments, the comparing includes comparing the amount of particulate accumulation to the predefined accumulation threshold. In still further embodiments, the method includes determining that the bake chamber and/or the bake chamber lid assembly requires cleaning if the amount of particulate accumulation exceeds the predefined accumulation threshold.

In additional embodiments, the monitoring includes capturing spectral information from the inside surface of the bake chamber and/or the bake chamber lid assembly, processing the spectral information to detect a spectral change, and equating the spectral change, or a surface area affected by the spectral change, to an amount of particulate accumulation. In further embodiments, the comparing includes comparing the amount of particulate accumulation to the predefined accumulation threshold. In still further embodiments, the method includes determining that the bake chamber and/or the bake chamber lid assembly requires cleaning if the amount of particulate accumulation exceeds the predefined accumulation threshold.

In additional embodiments, the method includes performing one or more actions based upon when the bake chamber and/or the bake chamber lid assembly requires cleaning, and the one or more actions includes at least one of signaling an alarm, logging an event, interrupting a processing step, or initiating a cleaning cycle.

For one embodiment, a system is disclosed including a bake chamber configured to perform a bake process for a substrate, one or more sensors, and a controller. The bake chamber includes a processing chamber, a bake plate disposed within the processing chamber and configured to thermally treat a substrate mounted onto the bake plate, and a bake chamber lid assembly forming a portion of the processing chamber. The one or more sensors are configured to monitor particulate accumulation on an inside surface of the bake chamber and/or the bake chamber lid assembly. The controller is coupled to the one or more sensors and configured to determine if the bake chamber and/or the bake chamber lid assembly requires cleaning.

In additional embodiments, the one or more sensors are positioned within or on an inner surface of the bake chamber lid assembly. In further embodiments, the one or more sensors include at least one quartz crystal microbalance (QCM) sensor, which is configured to monitor particulate accumulation on the inner surface of the bake chamber lid assembly by detecting a mass variation per unit area on a surface of a quartz crystal resonator of the QCM sensor. In still further embodiments, the controller is configured to compare the mass variation per unit area to a predefined mass threshold and determine that the bake chamber lid assembly requires cleaning if the mass variation per unit area exceeds the predefined mass threshold.

In additional embodiments, the one or more sensors are positioned on an inside surface of the bake chamber or an outside surface of the bake chamber. In further embodiments, the one or more sensors include at least one camera, which is configured to monitor particulate accumulation on the inside surface of the bake chamber and/or the bake chamber lid assembly by capturing digital images of the inside surface of the bake chamber and/or the bake chamber lid assembly. In still further embodiments, the controller is configured to process the digital images captured by the at least one camera to detect a color change on the inside surface, equate the color change, or a surface area affected by the color change, to an amount of particulate accumulation, compare the amount of particulate accumulation to a predefined accumulation threshold, and determine that the bake chamber and/or the bake chamber lid assembly requires cleaning if the amount of particulate accumulation exceeds the predefined accumulation threshold.

In additional embodiments, the one or more sensors include at least one spectrometer, which is configured to monitor particulate accumulation on the inside surface of the bake chamber and/or the bake chamber lid assembly by capturing spectral information from the inside surface of the bake chamber and/or the bake chamber lid assembly. In further embodiments, the controller is configured to process the spectral information captured by the at least one spectrometer to detect a spectral change on the inside surface, equate the spectral change, or a surface area affected by the spectral change, to an amount of particulate accumulation, compare the amount of particulate accumulation to a predefined accumulation threshold, and determine that the bake chamber and/or the bake chamber lid assembly requires cleaning if the amount of particulate accumulation exceeds the predefined accumulation threshold.

Different or additional features, variations, and embodiments can also be implemented, and related systems and methods can be utilized as well.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Embodiments are disclosed to monitor the accumulation of particulates on inner surfaces of a bake chamber, so that bake chamber cleaning can be done when necessary, rather than on a preventative maintenance cleaning schedule. These novel embodiments are described with respect to FIGS. 5-7 below.

Figure 1:
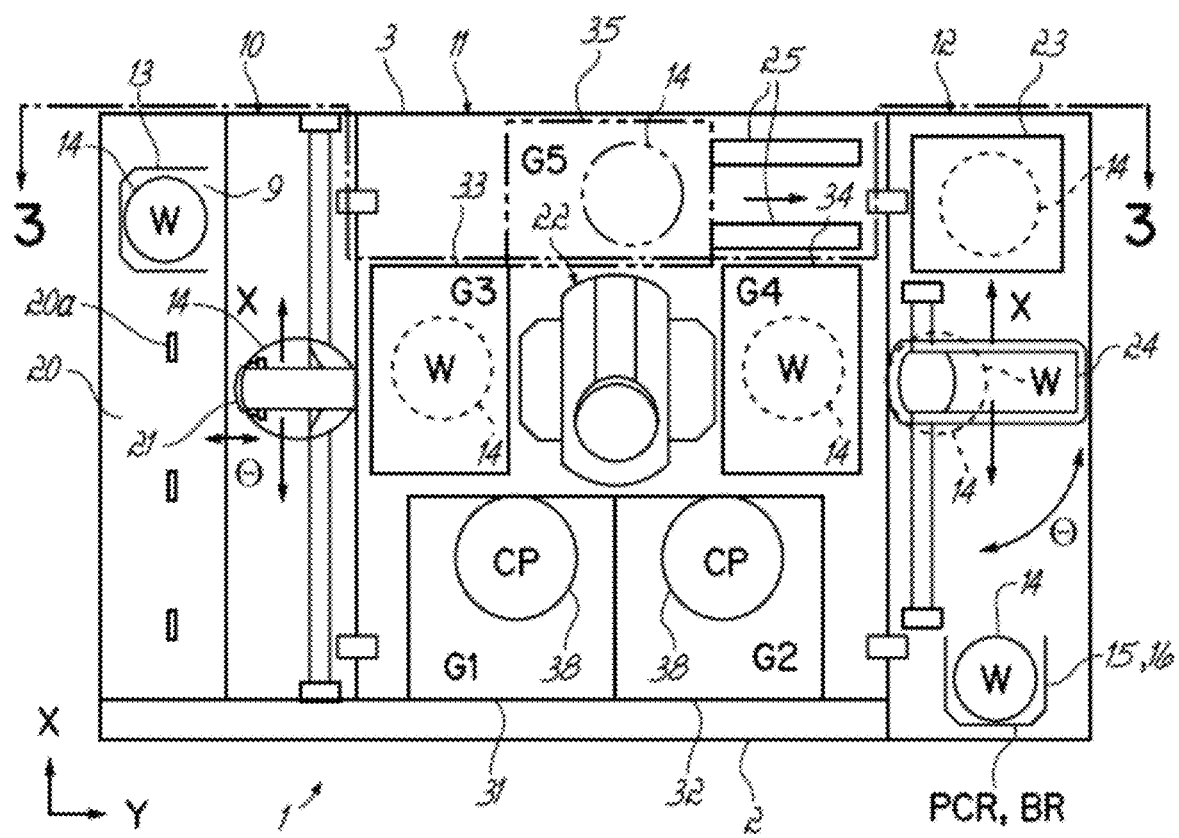
FIG. 1 (Prior Art) is a top view of a coating/developing processing system including at least one bake chamber.
Figure 2:
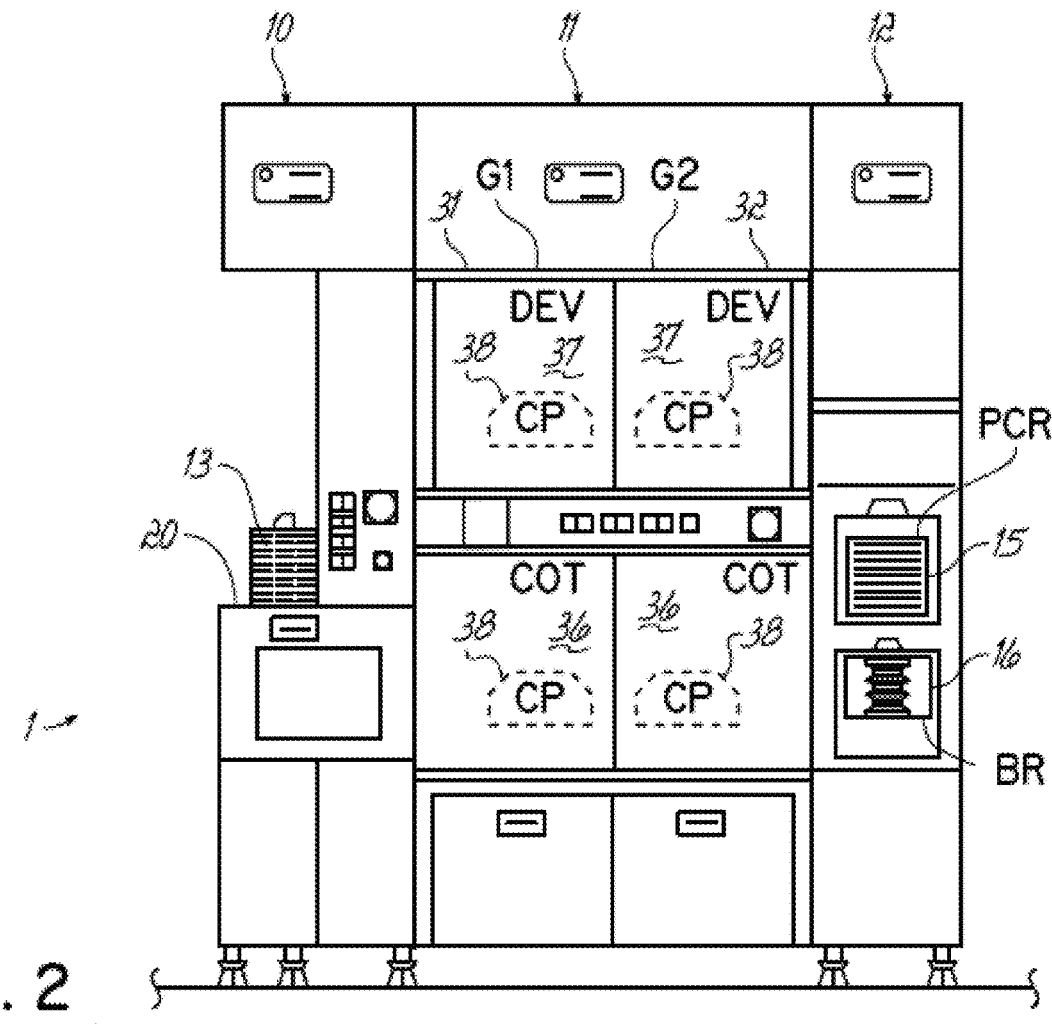
FIG. 2 (Prior Art) is a front view of the coating/developing processing system shown in FIG. 1 (Prior Art).
Figure 3:
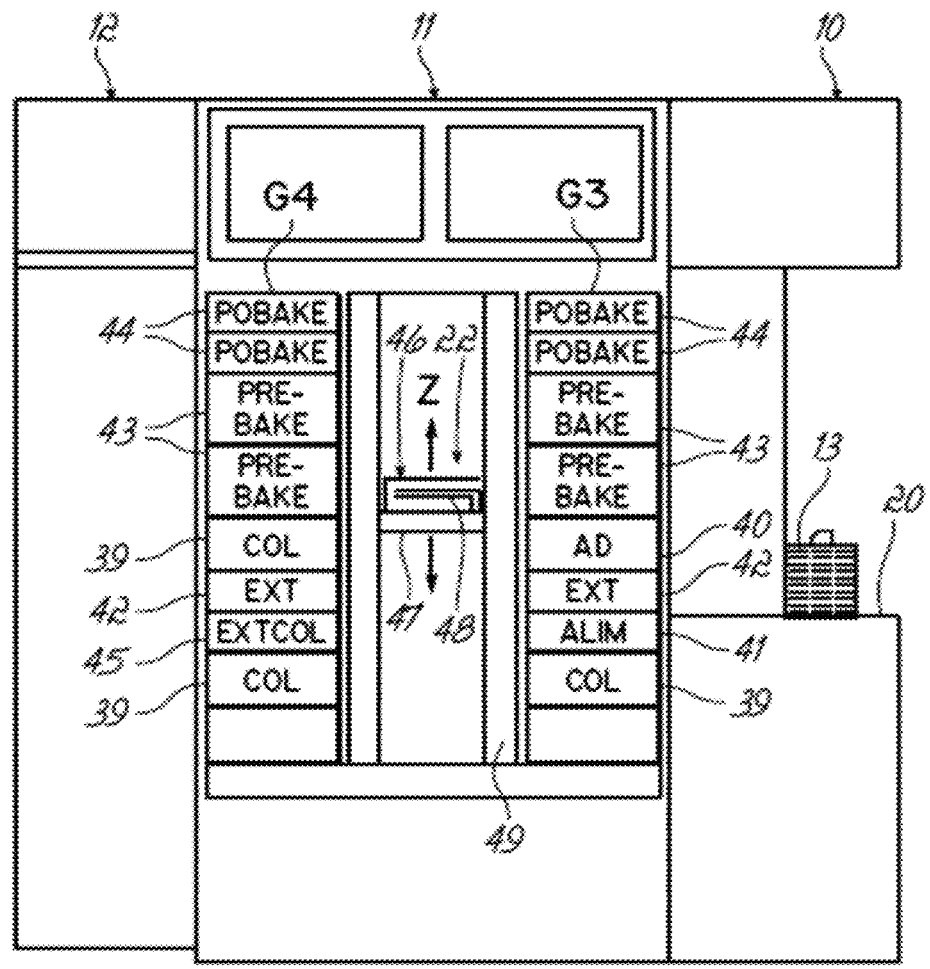
FIG. 3 (Prior Art) is a partially cut-away back view of the coating/developing processing system shown in FIG. 1 (Prior Art), as taken along line 3-3.
Figure 4A:
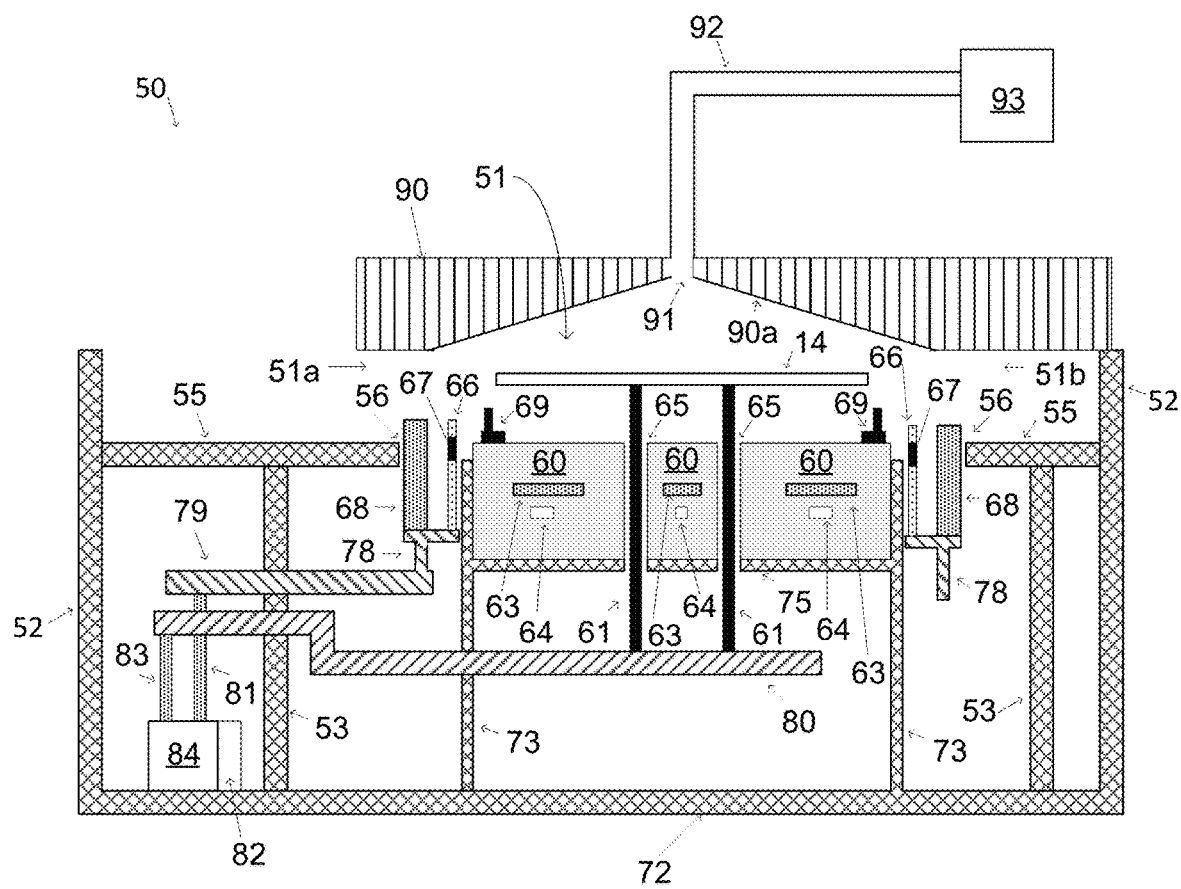
FIGS. 4A-4B (Prior Art) are cross-sectional views of a bake chamber that may be included within the coating/developing processing system shown in FIG. 1 (Prior Art).
Figure 4B:
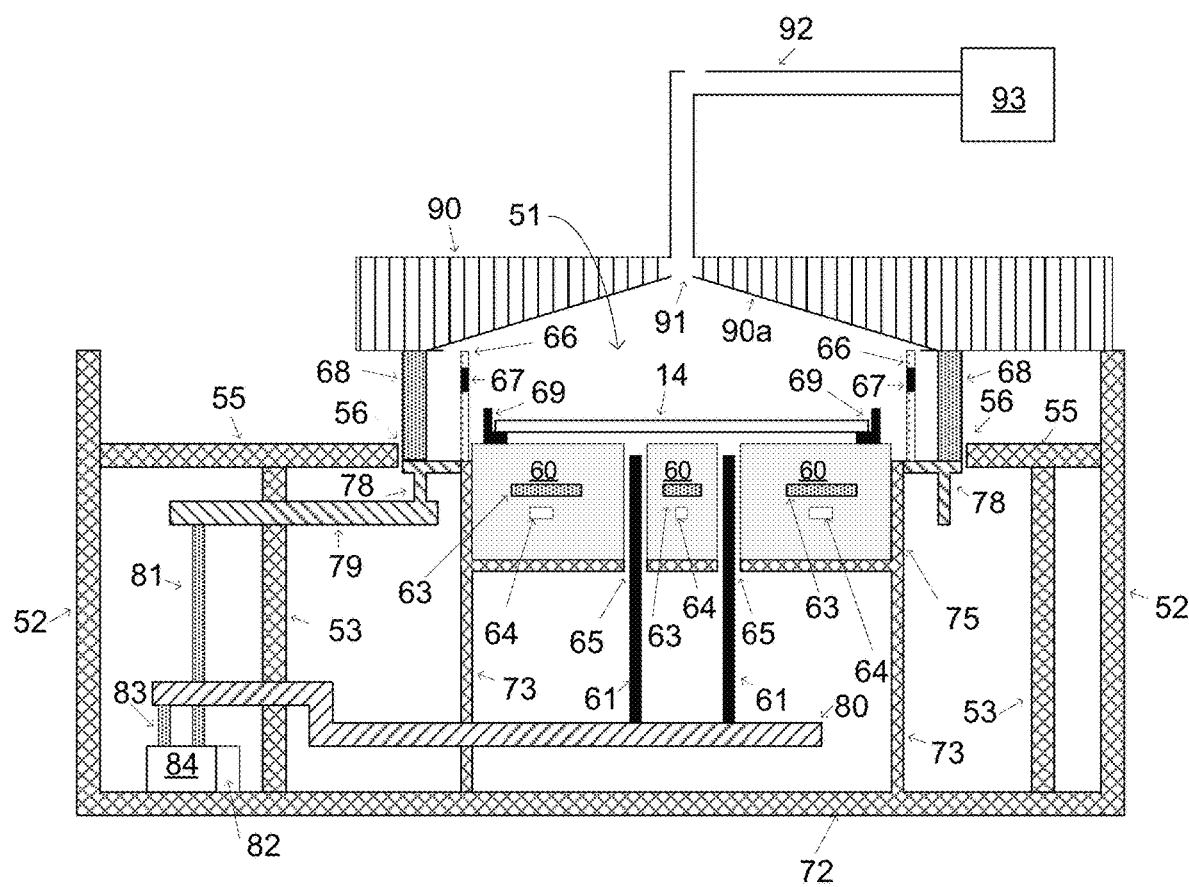

FIGS. 1-3 (Prior Art) are initially described and provide example coating/developing processing systems in which the monitoring and control techniques described herein may be incorporated. FIGS. 4A-4B (Prior Art) are then described and provide example bake chambers in which the monitoring and control techniques described herein may be incorporated.

Look first to FIGS. 1-3 (Prior Art), a coating/developing processing system 1 is shown and may include various components for processing substrates (e.g., semiconductor wafers) including one or more components configured to thermally treat (i.e., bake) the substrates for processing purposes. It will be recognized, however, that the coating/developing processing system 1 shown in FIGS. 1-3 (Prior Art) is merely one example processing system in which the monitoring and control techniques described herein may be used. Thus, the disclosure of the processing system shown in FIGS. 1-3 (Prior Art) is not meant to be limiting, but rather merely representative of one example processing system within which the monitoring and control techniques described herein may be utilized. Further, though the processing system of FIGS. 1-3 (Prior Art) is described with reference to a system for processing substrates, which are semiconductor wafers, it will be recognized that the techniques described herein may be utilized when processing other types of substrates. Thus, it will be recognized that the monitoring and control techniques described herein may be utilized with a wide range of processing systems that apply heat to a wide range of substrates.

With reference to FIGS. 1-3 (Prior Art), a coating/developing processing system 1 may generally include a load/unload section 10, a process section 11, and an interface section 12. The load/unload section 10 has a cassette table 20 on which cassettes 13, each storing a plurality of semiconductor wafers (W) 14 (e.g., 25), are loaded and unloaded from the coating/developing processing system 1. The process section 11 has various single wafer processing units for processing the wafer 14 sequentially one by one. These processing units are arranged in predetermined positions of multiple stages, for example, within first (G1), second (G2), third (G3), fourth (G4) and fifth (G5) process unit group 31, 32, 33, 34, 35. The interface section 12 is interposed between the process section 11 and one or more light exposure systems (not shown), and is configured to transfer resist coated wafers between the process sections. The one or more light exposure systems can include a resist patterning system, such as a photolithography tool that transfers the image of a circuit or a component from a mask or onto a resist on the wafer surface.

As shown in FIG. 1 (Prior Art), the load/unload section 10 includes a plurality of projections 20a, which are formed on the cassette table 20 and used to orient each of the plurality of cassettes 13 relative to the process section 11. Each of the cassettes 13 mounted on the cassette table 20 has a load/unload opening 9 facing the process section 11. The load/unload section 10 further includes a first sub-arm mechanism 21 that is responsible for loading/unloading the wafer W into/from each of the cassettes 13. The first sub-arm mechanism 21 has a holder portion for holding the wafer 14, an X-axis moving mechanism (not shown) for moving the holder portion in an X-axis direction, a Y-axis moving mechanism (not shown) for moving the holder portion in a Y-axis direction, a Z-axis moving mechanism (not shown) for moving the holder portion in a Z-axis direction, and a θ (theta) rotation mechanism (not shown) for rotating the holder portion around the Z-axis. The first sub-arm mechanism 21 can gain access to an alignment unit (ALIM) 41 and an extension unit (EXT) 42 belonging to a third (G3) process unit group 33, as shown in FIG. 3 and described further below.

As shown in FIGS. 1 and 3 (Prior Art), a main arm mechanism 22 is liftably arranged at the center of the process section 11. The process unit groups G1-G5 are arranged around the main arm mechanism 22. The main arm mechanism 22 is arranged within a cylindrical supporting body 49 and has a liftable wafer transporting system 46. The cylindrical supporting body 49 is connected to a driving shaft of a motor (not shown). The driving shaft may be rotated about the Z-axis in synchronism with the wafer transporting system 46 by an angle of θ. The wafer transporting system 46 has a plurality of holder portions 48 movable in a front and rear direction of a transfer base table 47.

As shown in FIG. 1 (Prior Art), a movable pick-up cassette (PCR) 15 and a non-movable buffer cassette (BR) 16 are arranged in two stages at the front side of the interface section 12. At the backside of the interface section 12, a peripheral light exposure system 23 is arranged. The peripheral light exposure system 23 may contain, for example, a lithography tool. Alternately, the lithography tool may be remote to, and cooperatively coupled to, the coating/developing processing system 1. At the center portion of the interface section 12, a second sub-arm mechanism 24 is provided, which is movable independently in the X and Z directions, and which is capable of gaining access to both cassettes (PCR) 15 and (BR) 16 and the peripheral light exposure system 23. In addition, the second sub-arm mechanism 24 is rotatable around the Z-axis by an angle of θ and is designed to be able to gain access not only to the extension unit (EXT) 42 located in the fourth (G4) process unit group 34 but also to a wafer transfer table (not shown) near a remote light exposure system (not shown).

As shown in FIG. 1 (Prior Art), processing units belonging to first (G1) and second (G2) process unit groups 31, 32, are arranged at a front portion 2 of the coating/developing processing system 1. Processing units belonging to the third (G3) process unit group 33 are arranged next to the load/unload section 10. Processing units belonging to the fourth (G4) process unit group 34 are arranged next to the interface section 12. Processing units belonging to the fifth (G5) process unit group 35 are arranged in a back portion 3 of the coating/developing processing system 1.

With specific reference to FIG. 2 (Prior Art), the first (G1) process unit group 31 and the second (G2) process unit group 32 each include two spinner-type processing units (i.e., liquid dispense units) for applying a predetermined treatment to the wafer 14, which is mounted on a spin chuck (not shown in FIG. 2) within a cup (CP) 38. In FIG. 2 (Prior Art), the first (G1) process unit group 31 and the second (G2) process unit group 32 each include a resist coating unit (COT) 36 and a developing unit (DEV) 37, which are stacked in two stages sequentially from the bottom. In the exemplary system shown in FIG. 2, the resist coating unit (COT) 36 is set at a lower stage than the developing unit (DEV) 37 because a drain line (not shown in FIG. 2) for the resist waste solution is desired to be shorter than a drain line (not shown in FIG. 2) for the developing waste solution for the reason that the resist waste solution is more difficult to discharge than the developing waste solution. However, if necessary, the resist coating unit (COT) 36 may be arranged at an upper stage relative to the developing unit (DEV) 37.

With specific reference to FIG. 3 (Prior Art), the third (G3) process unit group 33 has a cooling unit (COL) 39, an alignment unit (ALIM) 41, an adhesion unit (AD) 40, an extension unit (EXT) 42, two prebaking units (PREBAKE) 43, and two postbaking units (POBAKE) 44, which are stacked sequentially from the bottom. Similarly, the fourth (G4) process unit group 34 has a cooling unit (COL) 39, an extension-cooling unit (EXTCOL) 45, an extension unit (EXT) 42, another cooling unit (COL) 39, two prebaking units (PREBAKE) 43 and two postbaking units (POBAKE) 44 stacked sequentially from the bottom. Although, only two prebaking units 43 and only two postbaking units 44 are shown, the third (G3) process unit group 33 and the fourth (G4) process unit group 34 may contain substantially any number of prebaking units 43 and postbaking units 44. Furthermore, any or all of the prebaking units 43 and postbaking units 44 may be configured to perform a bake process, such as a Post Application Bake (PAB) process, a Post Exposure Bake (PEB) process, an Electrostatic Post Exposure Bake (EPEB) process, a Post Development Bake (PDB) process, etc.

In some implementations, the cooling unit (COL) 39 and the extension cooling unit (EXTCOL) 45 are operated at low processing temperatures and arranged at lower stages, and the prebaking unit (PREBAKE) 43, the postbaking unit (POBAKE) 44 and the adhesion unit (AD) 40 are operated at high temperatures and arranged at the upper stages. Although thermal interference between units may be reduced with this arrangement, these units may have different arrangements in other implementations. In one exemplary implementation, the prebaking unit (PREBAKE) 43, the postbaking unit (POBAKE) 44, and the adhesion unit (AD) 40 can each include a bake chamber in which wafer 14 is heated to temperatures above room temperature.

With specific reference to FIG. 1 (Prior Art), the fifth (G5) process unit group 35 may be arranged at the back portion 3 of the backside of the main arm mechanism 22. The fifth (G5) process unit group 35 may be slidably shifted in the Y-axis direction along a guide rail 25. Since the fifth (G5) process unit group 35 may be shifted as mentioned, maintenance operation may be applied to the main arm mechanism 22 easily from the backside.

As mentioned above, the system of FIGS. 1-3 (Prior Art) is merely exemplary and the monitoring and control techniques described herein may be applied to a wide range of processing systems, all as would be recognized by one skilled in the art. In some embodiments, the resist coating units (COT) 36 and developing units (DEV) 37 shown in FIG. 2 (Prior Art) and described above may be utilized to apply layers or films, such as spin-on hard masks, imaging layers (PR or photoresist), anti-reflective coating layers (e.g., silicon anti-reflective coating (SiARC), topcoat anti-reflective (TARC) layers, bottom anti-reflective coating (BARC) layers, etc.), to a surface of a wafer. In some embodiments, additional coating units and/or developing units may be provided for applying other layers utilized in a lithography process. In some embodiments, the prebaking units 43 and postbaking units 44 shown in FIG. 2 (Prior Art) and described above may be utilized to bake, cure or harden the layers or films applied to the wafer. In some embodiments, additional baking units may be provided for baking other layers utilized in a lithography process.

FIG. 4A-B (Prior Art) are simplified cross-sectional views of a bake chamber 50 configured to perform a bake process, such as a PAB, PEB, EPEB, or PDB process. In some embodiments, the bake chamber 50 shown in FIGS. 4A and 4B may be included within a prebaking unit (PREBAKE) 43, a postbaking unit (POBAKE) 44, and/or an adhesion unit (AD) 40 of the coating/developing processing system 1 shown in FIGS. 1-3. Alternatively, the bake chamber 50 shown in FIGS. 4A and 4B may be a stand-alone bake chamber.

As shown in FIGS. 4A-4B (Prior Art), bake chamber 50 may generally include a processing chamber 51, a bake plate 60 disposed within the processing chamber 51, and a bake chamber lid assembly 90 forming a portion of the processing chamber 51. One or more resistance heaters 63 can be embedded within bake plate 60 to generate heat, which is used to thermally treat (i.e., bake) a wafer 14 mounted onto an upper surface of the bake plate. In addition, one or more temperature sensors 64 can be embedded within bake plate 60 to measure the temperature of the bake plate.

As shown in FIGS. 4A-4B (Prior Art), a diameter of bake plate 60 may be slightly larger than a diameter of the wafer 14. In one example, wafer 14 can be 200 mm, 300 mm, or 450 mm in diameter, and the diameter of bake plate 60 can be approximately 2-10 mm greater than the diameter of the wafer 14 mounted thereon. In some embodiments, a plurality of small wafer supports 62 can be formed on an upper surface of bake plate 60 for accurately positioning the wafer 14 on the bake plate. When a wafer 14 is mounted on bake plate 60, top portions of these small wafer supports 62 may contact a backside surface of the wafer 14, and a small gap can be established between the wafer 14 and the bake plate 60 that prevents the backside surface of the wafer 14 from being strained and/or damaged. Alternatively, other wafer support means may be used.

In FIGS. 4A-4B (Prior Art), bake chamber 50 is bounded by one or more exterior vertical sidewalls 52 and an exterior bottom wall 72, which is coupled to the exterior vertical sidewall(s) 52. The one or more exterior vertical sidewalls 52 and the exterior bottom wall 72 can have circular, elliptical, square, or rectangular shapes. The bake chamber 50 may further include at least one horizontal shielding plate 55, one or more first interior walls 53 and one or more second interior walls 73. The at least one horizontal shielding plate 55 can be coupled to at least one of the exterior vertical sidewall(s) 52. The one or more first interior walls 53 and the one or more second interior walls 73 can each be coupled to the exterior bottom wall 72 and the horizontal shielding plate 55. The at least one horizontal shielding plate 55, the one or more first interior walls 53 and the one or more second interior walls 73 can have circular, elliptical, square, or rectangular shapes.

A first opening 56 formed within horizontal shielding plate 55 may also have a circular, elliptical, square, or rectangular shape. A first supporting plate 75, which is disposed within the first opening 56 below the horizontal shielding plate 55, can be coupled to the one or more second interior walls 73. The first supporting plate 75 can have a circular, elliptical, square, or rectangular shape. The bake plate 60 can be mounted within a mounting region, which is formed by the second interior walls 73 and the first supporting plate 75. The bake plate 60 and the mounting region can have circular, elliptical, square, or rectangular shapes.

The bake plate 60 and the first supporting plate 75 can each include a plurality of through-holes 65 and a plurality of lift pins 61, which can be inserted into the through-holes 65. The lift pins 61 can be connected to, and supported by a first support arm 80, which is further connected to and supported by a first lifting rod 83 of a first lifting cylinder 84. When the first lifting rod 83 is actuated to move relative to the first lifting cylinder 84, the lift pins 61 move vertically relative to the bake plate 60, thereby lifting or lowering the wafer 14 from the upper surface of the bake plate 60. For example, when the first lifting rod 83 is actuated to protrude from the first lifting cylinder 84, the lift pins 61 can protrude from the bake plate 60, thereby lifting the wafer 14 from the upper surface of the bake plate 60.

A second supporting plate 78, which is disposed within the first opening 56 below the horizontal shielding plate 55, may be connected to and supported by a second support arm 79, which is further connected to and supported by a second lifting rod 81 of a second lifting cylinder 82. The second supporting plate 78 can have a circular, elliptical, square, or rectangular shape. At least one shutter 68 and at least one supply ring 66 can be coupled to a top surface of the second supporting plate 78. The shutter 68 and the supply ring 66 can have circular, elliptical, square, or rectangular shapes. When the second lifting rod 81 is actuated to move vertically relative to the second lifting cylinder 82, the shutter 68 and the supply ring 66 can move vertically relative to the bake plate 60, thereby opening or closing the processing chamber 51. For example, when the second lifting rod 81 is actuated to recede into the second lifting cylinder 82, the shutter 68 and the supply ring 66 are pulled down to form openings 51a and 51b in the processing chamber 51, so that wafer 14 can be transferred into or out of the processing chamber 51.

For additional embodiments, a chamber lid having integrated sides can be used rather than the shutter 68 as described above. For example, rather than having a shutter 68 that moves as described above, a chamber lid is used that has integrated sides. The entire chamber lid then moves up and down. For example, the chamber lid can move up to allow a cooling arm to access the system and deliver a wafer, and the chamber lid can move down for the bake processing. Other variations could also be implemented.

In some cases, air holes 67 can be formed along the periphery of the supply ring 66 at intervals of central angles of about two degrees. The air holes 67 can communicate with a cooling gas supply source (not shown). Alternatively, the supply ring 66 may be configured differently and/or mounted differently. When the supply ring 66 is in the "up" position shown in FIG. 4B, a gas (e.g., nitrogen gas or air) can be exhausted using the air holes 67. For example, air holes 67 can be used to expose one or more surfaces of the bake plate 60 to an inert gas stream for rapidly cooling the one or more surfaces of the bake plate 60 when a wafer is not present on the bake plate 60. For example, the inert gas can include argon (Ar) or nitrogen ($N_2$). In addition, air holes 67 can be used to expose one or more surfaces of the wafer 14 to an inert gas stream for rapidly cooling one or more surfaces of the wafer 14 when a wafer is positioned on the bake plate 60.

When bake chamber 50 is configured in a wafer transfer mode and the processing chamber 51 is in an open configuration, as shown in FIG. 4A, the lift pins 61, the first support arm 80, and the first lifting rod 83 are positioned in an "up" position, and the shutter 68, the supply ring 66, the second supporting plate 78, and the second lifting rod 81 are positioned in a "down" position. When the processing chamber 51 is in the open configuration shown in FIG. 4A, openings 51*a* and 51*b* formed at a front surface side and a rear surface side of processing chamber 51 can be used to load/unload the wafer 14 into/out of the processing chamber 51.

When bake chamber 50 is configured in an operating mode and the process chamber 51 is in a closed configuration, as shown in FIG. 4B (Prior Art), the lift pins 61, the first support arm 80, and the first lifting rod 83 are positioned in a "down" position, and the shutter 68, the supply ring 66, the second supporting plate 78, and the second lifting rod 81 are positioned in an "up" position. When the processing chamber 51 is in the closed configuration shown in FIG. 4B, the lift pins 61 are lowered to position the wafer 14 onto the bake plate 60, and the shutter 68 and the supply ring 66 are pushed up to close the openings 51*a* and 51*b*, so that wafer 14 can be processed in the closed processing chamber 51.

When bake chamber 50 is configured in an operating mode and the process chamber 51 is in a closed configuration, as shown in FIG. 4B (Prior Art), the temperature of bake plate 60 is raised (via resistance heaters 63) to thermally treat wafer 14. For example, the temperature of bake plate 60 may be increased to a temperature range between about 80° C. and about 250° C. to thermally treat (i.e., bake) one or more layers or films that were previously applied or deposited onto wafer 14. Typical layers or films include topcoat barrier layers (TC), topcoat antireflective coating layers (TARC), bottom antireflective coating layers (BARC), imaging layers such as photoresist (PR), sacrificial layers, and barrier layers such as hard mask layers for etch stopping. The bake process time and temperature are used to drive out solvents in the applied film to cure or harden the film.

The bake chamber lid assembly 90 includes an inner surface 90*a*, which forms a portion of the processing chamber 51. During a bake process, gas generated from the surface of wafer 14 before, during, and/or after the bake process may be exhausted through the exhaust port 91 formed in bake chamber lid assembly 90, and vented from processing chamber 51 via exhaust line 92 and exhaust unit 93. Alternatively, the exhaust port 91 and exhaust line 92 may be configured differently and/or mounted to another portion of the bake chamber 50.

When gas is exhausted through the exhaust port 91 formed within bake chamber lid assembly 90, sublimation particles (solids), out-gassing (liquid) materials and/or other hard material may condense or otherwise be deposited on the inner surface 90*a* of the bake chamber lid assembly 90, in exhaust port 91 and/or in the exhaust line 92. Over time, the hard material builds up and creates particulates, which may eventually shed or peel off the inner surface 90*a*, exhaust port 91 and/or exhaust line 92. Since wafer 14 is mounted directly below bake chamber lid assembly 90, particulates that accumulate on the bake chamber lid assembly tend to fall off onto the wafer, causing excursions (i.e., errors) in the bake process that may lead to wafer defects.

As noted above, a periodic preventive maintenance cleaning cycle is typically used to clean the particulate build-up that develops on the inside of bake chamber 50 and/or on the inner surface 90*a* of bake chamber lid assembly 90. For example, bake chamber 50 and/or bake chamber lid assembly 90 may be periodically cleaned after a predetermined number of wafers have been processed (e.g., after about 4,000 to 15,000 wafers have been processed), after a predetermined amount of bake process time, or other selected timing. For example, preventative maintenance (PM) including cleaning of the bake chamber 50 and/or bake chamber lid assembly 90 can occur at a predetermined total time since the last maintenance. In many cases, a conservative approach is used to ensure that bake chamber 50 and/or bake chamber lid assembly 90 is cleaned well before particulate accumulation becomes a problem. Although a conservative preventative maintenance schedule prevents bake process excursions and reduces wafer defects, it takes the bake chamber down for maintenance more often than is necessary.

Figure 5:
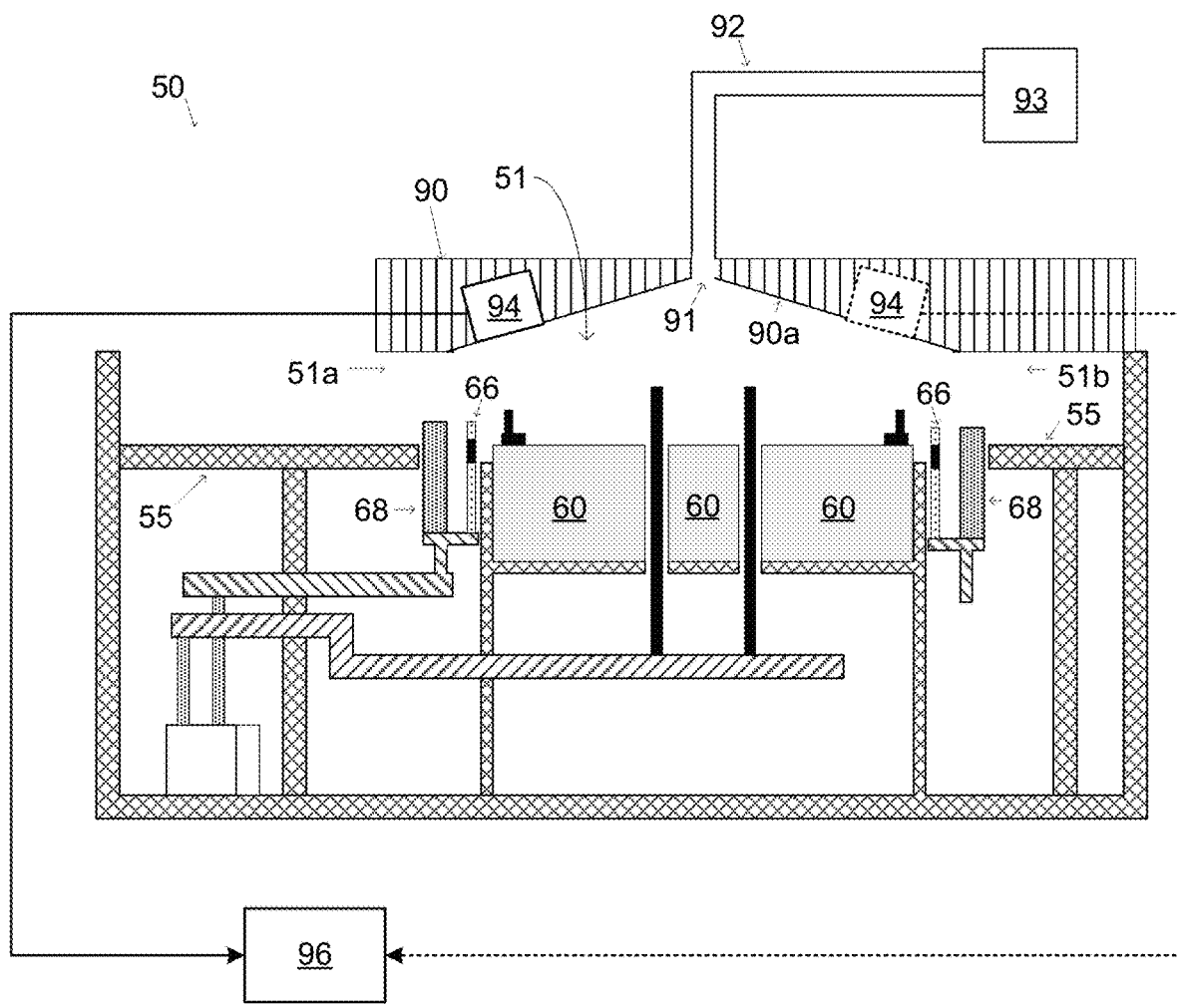
FIG. 5 is a block diagram illustrating one embodiment of a monitoring system that may be used to monitor particle accumulation within a bake chamber and determine when the bake chamber requires cleaning.
Figure 6:
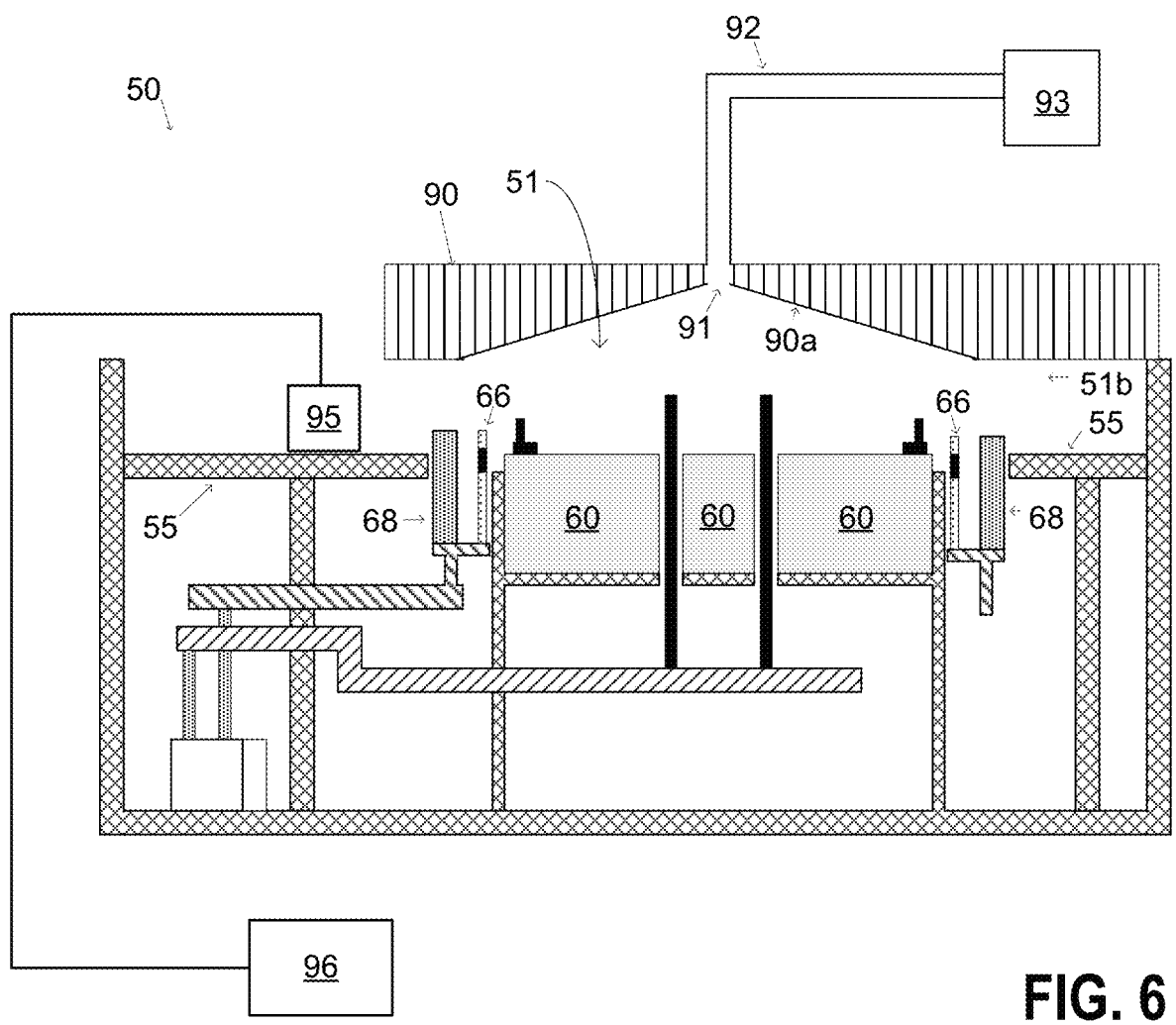
FIG. 6 is a block diagram illustrating another embodiment of a monitoring system that may be used to monitor particle accumulation within a bake chamber and determine when the bake chamber requires cleaning.
Figure 7:
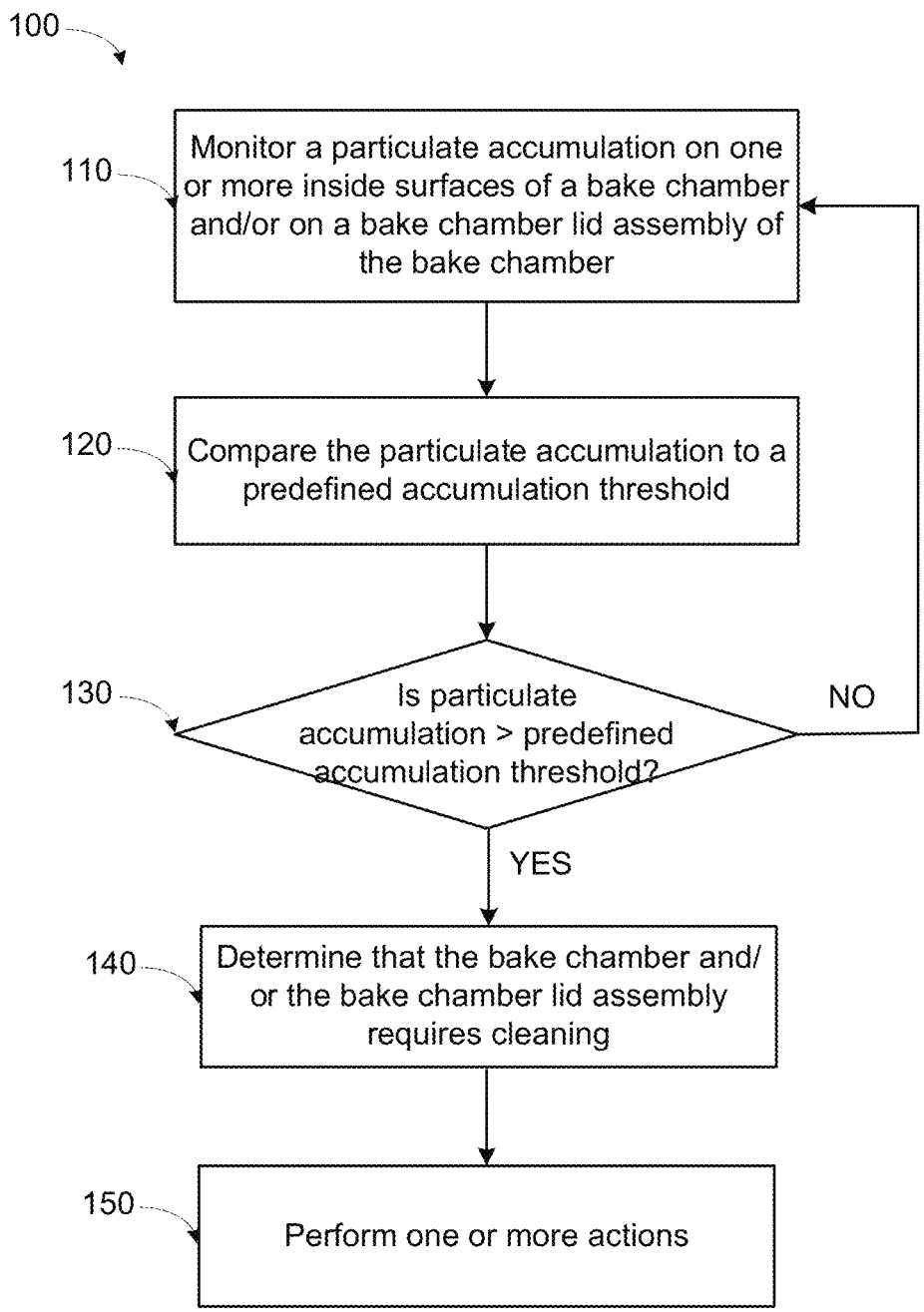
FIG. 7 is a flowchart diagram illustrating one embodiment of a method that may be used to monitor particle accumulation within a bake chamber and determine when the bake chamber requires cleaning.

FIGS. 5-7 provide example embodiments for the novel techniques described herein to monitor the accumulation of particulates on inner surfaces of a bake chamber, so that bake chamber cleaning can be done when necessary, rather than on a preventative maintenance cleaning schedule. In order to avoid unnecessary cleaning cycles and extend manufacturing time, the present disclosure provides various embodiments of monitoring systems and methods that may be used to monitor particulate accumulation inside a bake chamber to determine when bake chamber cleaning is needed. In some embodiments, the monitoring systems and methods disclosed herein may be used to detect an amount of particulate accumulation on one or more inside surfaces of a bake chamber and/or a bake chamber lid assembly, and to initiate or trigger a cleaning cycle for the bake chamber and/or the bake chamber lid assembly when the detected amount of particulate accumulation exceeds a predefined accumulation threshold. Although not strictly limited to such, the particulates deposited or condensed on the inside surface(s) of the bake chamber may be a result of sublimation and/or outgassing from a surface of a wafer before, during, and/or after the wafer is thermally treated (or baked) to cure or harden the film.

As described in more detail below, the embodiments of monitoring systems disclosed herein may generally include one or more sensors and a controller, which is coupled to receive a sensor output from the one or more sensors. The one or more sensors may be generally configured to monitor particulate accumulation on one or more inside surfaces of a bake chamber and/or a bake chamber lid assembly. The controller may use the sensor output to determine when cleaning is needed. In the disclosed embodiments, different types of sensors may be used to monitor particulate accumulation on the inside of the bake chamber and/or the bake chamber lid assembly.

In some embodiments, various types of surface acoustic wave (SAW) based sensors may be incorporated within the bake chamber and/or within the bake chamber lid assembly to monitor the amount of particulate accumulation on the inside of the bake chamber and/or the bake chamber lid assembly. The SAW based sensors can be, for example, a quartz crystal microbalance (QCM) sensor, a pressure and/or strain SAW sensor, and/or other SAW based sensors or combination of sensors.) In other embodiments, various types of optical sensors may be incorporated within (or coupled to) the bake chamber to monitor particulate accumulation on the inside of the bake chamber and/or the bake chamber lid assembly. The optical sensors can include, for example, a photodetector, a photo resistor, a camera, a charge coupled device (CCD), a complimentary-metal-oxide-semiconductor (CMOS) image sensor, an n-type metal oxide semiconductor (NMOS) image sensor including visible (VIS) and/or infrared (IR) image sensing, an indium-gallium-arsenic (InGaAs) image sensor, an indium-antimony (InSb) image sensor, a spectrometer, and/or other optical sensors as well as combinations of sensors.

In the disclosed embodiments, the sensor output is supplied to the controller for further processing. In some embodiments, the controller may use the sensor output to detect, quantify or predict an amount of particulate accumulation deposited or condensed on one or more inside surfaces of the bake chamber and/or the bake chamber lid assembly, compare the amount of particulate accumulation to a predefined accumulation threshold, and determine whether or not cleaning is needed based on the comparison. In other embodiments, the controller may compare the sensor output directly to a predefined accumulation threshold to determine if cleaning is needed.

In some embodiments, the predefined accumulation threshold may be determined from a relationship model, which was previously established between the sensor output (or the amount of particulate accumulation detected from the sensor output) and empirically determined need for cleaning, for example, from inspection of the system. Using comparisons to the predefined accumulation threshold, a cleaning cycle can be initiated or triggered only when necessary (e.g., prior to excessive particulate accumulation), rather than based on a conservative preventative maintenance cleaning schedule. In other embodiments, a predefined accumulation threshold may be determined from a correlation of sensor output data to defect metrology results, for example, from internal metrology, from offline metrology, or from other metrology measurements.

FIGS. 5 and 6 illustrate various embodiments of a monitoring system that may be used to monitor particulate accumulation within a bake chamber and determine when bake chamber cleaning is needed. The bake chamber may be a stand-alone bake chamber or may be integrated within a substrate processing system, such as but not limited to, the coating/developing processing system 1 shown in FIGS. 1-3 (Prior Art). Although the monitoring system shown in FIGS. 5 and 6 is incorporated within a particular bake chamber, such as the example bake chamber 50 shown in FIGS. 4A-4B (Prior Art), the monitoring systems and methods disclosed herein may be alternatively incorporated within other types and/or configurations of bake chambers or thermal processing units used to thermally treat substrates, such as semiconductor wafers.

As shown in FIGS. 5 and 6, the monitoring system disclosed herein may generally include one or more sensors 94/95 to monitor particulate accumulation on one or more inside surfaces of a bake chamber and/or a bake chamber lid assembly, and a controller 96 that is coupled to receive a sensor output from the one or more sensors and use the sensor output to determine when a cleaning cycle is needed for the bake chamber and/or the bake chamber lid assembly.

In FIG. 5, one or more sensors 94 are incorporated within (or coupled to) the bake chamber lid assembly 90 of bake chamber 50. Examples of sensor(s) 94 that may be incorporated within (or coupled to) bake chamber lid assembly 90 include, but are not limited to, SAW based sensors (e.g., a quartz crystal microbalance (QCM) sensor, pressure/strain SAW sensor, etc.), pressure sensors and other types of sensors, which may be used to detect, quantify or predict an amount of particulate accumulation that develops over time on the inner surface 90a of the bake chamber lid assembly.

In the particular embodiment shown in FIG. 5, the one or more sensors 94 are positioned within (or on) an inner surface 90a of the bake chamber lid assembly 90, and are configured to monitor the accumulation of particulates deposited or condensed thereon when the bake chamber lid assembly is in an open configuration (as shown, e.g., in FIG. 4A) or in a closed configuration (as shown, e.g., in FIG. 4B). Although FIG. 5 depicts one (or possibly two) sensors 94 positioned on the inner surface(s) 90a of bake chamber lid assembly 90, an alternative number and/or arrangement of sensors 94 may alternatively be used to monitor particulate accumulation deposited or condensed on the inner surface(s) of the bake chamber lid assembly.

Particulate accumulation on the inner surface 90a of the bake chamber lid assembly 90 is particularly problematic when gases within the processing chamber 51 are exhausted through the bake chamber lid assembly (e.g., via exhaust port 91, exhaust line 92 and exhaust unit 93). However, particulates may also accumulate on other inside surfaces of the bake chamber 50. In some embodiments, the one or more sensors 94 shown in FIG. 5 may additionally or alternatively be incorporated within (or coupled to) an inner surface of bake chamber 50 (such as, e.g., on vertical sidewalls 52, horizontal shielding plate 55, supply ring 66 or shutter 68) to detect, quantify or predict an amount of particulate accumulation that develops over time on the inner surface of the bake chamber. It is further noted that a QCM sensor can also be positioned on other surfaces within the bake chamber in addition to or instead of the back chamber lid assembly 90. Other variations could also be implemented.

In one example implementation, one or more QCM sensors may be used to implement the sensor(s) 94 shown in FIG. 5. As known in the art, a QCM sensor detects mass variation per unit area by measuring changes in the oscillation frequency of a quartz crystal resonator that occur when a mass (e.g., due to particulate accumulation) is deposited or condensed onto a surface of the resonator. When QCM sensor(s) 94 are incorporated within bake chamber lid assembly 90, the change in oscillation frequency measured by the QCM sensor(s) may be used to generate a sensor output, which is provided to controller 96.

In some embodiments, the sensor output may be the change in oscillation frequency measured by the QCM sensor(s) 94 when a mass (e.g., an accumulation of particulates) is deposited or condensed onto a surface of the resonator. In other embodiments, QCM sensor(s) 94 may equate the measured change in oscillation frequency to a mass variation per unit area, and may provide the mass variation per unit area to controller 96 as the sensor output.

In the embodiment shown in FIG. 5, controller 96 receives the sensor output from the one or more sensors 94, and uses the sensor output to predict an amount of particulate accumulation that may be deposited or condensed on the inner surface 90a of the bake chamber lid assembly 90. In some embodiments, controller 96 may use the change in oscillation frequency measured by one or more QCM sensor(s) 94 to calculate a mass variation per unit area on a surface of the resonator. Once calculated, controller 96 may compare the mass variation per unit area to a predefined mass threshold (i.e., a predefined accumulation threshold) to determine if bake chamber lid assembly 90 should be cleaned. Alternatively, if a mass variation per unit area is provided as the sensor output, controller 96 may compare the sensor output to the predefined mass threshold to determine if cleaning is needed. In some embodiments, the predefined mass threshold may be determined by running the systems with the QCM sensor in place, and then inspecting the systems for accumulation and related cleaning requirements. As indicated above, the predefined mass threshold can also be determined from a correlation of sensor output data to defect metrology results, for example, from internal metrology, from offline metrology, or from other metrology measurements.

In another example implementation, one or more pressure sensors may be used to implement the sensor(s) 94 shown in FIG. 5. In some embodiments, a pressure sensor such as an annular pressure sensor is positioned under one or more components of the bake chamber lid assembly 90. As such, the bake chamber lid assembly 90 is effectively coupled to and engaging the pressure sensor. As particulate accumulation occurs on the bake chamber lid assembly 90, this particulate accumulation increases the mass and thereby causes increased pressure on the pressure sensor positioned under the bake chamber lid assembly 90.

For one embodiment, the chamber lid has integrated sides and moves up and down. For example, the bake chamber lid assembly 90 can move up to allow a cooling arm to access the system and deliver a wafer, and the bake chamber lid assembly 90 can move down for the bake processing. For this embodiment, the pressure sensor can be incorporated as an annulus that the bake chamber lid assembly 90 sits on when in down position. The pressure sensor thereby measures the pressure induced by the weight of the entire bake chamber lid assembly 90. A baseline or initial pressure can be determined for a clean bake chamber lid assembly 90, and pressure increases from mass accumulation can be then be detected by the pressure sensor.

In the embodiment shown in FIG. 6, one or more sensors 95 are incorporated within (or coupled to) bake chamber 50, instead of bake chamber lid assembly 90. Examples of sensor(s) 95 that may be incorporated within (or coupled to) bake chamber 50 include, but are not limited to, optical sensors as described above, pressure sensors, and/or other types of sensors, which may be used to detect and/or quantify an amount of particulate accumulation that develops over time inside bake chamber 50 and/or on inner surfaces 90a of the bake chamber lid assembly 90. For one variation, it is noted that a thermal sensor can be used to detect thermal radiation emission differences between clean surfaces and surfaces with particulate accumulation for the inside surfaces of the bake chamber 50 or inner surfaces 90a of the bake chamber lid assembly 90.

In some embodiments, the sensor(s) 95 shown in FIG. 6 may be coupled to an inside surface of the bake chamber 50 (such as, e.g., on one or more inside surface(s) of vertical sidewall(s) 52, on horizontal shielding plate 55, on supply ring 66 or on shutter 68) to detect and/or quantify an amount of particulate accumulation that develops over time inside the bake chamber and/or on inner surfaces 90a of the bake chamber lid assembly 90. In other embodiments, the sensor(s) 95 shown in FIG. 6 may additionally or alternatively be coupled to an outside surface of the bake chamber 50 (e.g., on one or more outside surface(s) of vertical sidewall(s) 52). In order to detect and/or quantify an amount of particulate accumulation that develops over time inside of bake chamber 50 and/or on inner surfaces 90a of the bake chamber lid assembly 90, sensor(s) 95 coupled to an outside surface of the bake chamber may be mounted to a monitoring window formed within the outside surface. For example, the sensor(s) 95 can be integrated with an optical system positioned below plate 55 and looking at the inner surface 90a through an optical window. For example, the sensor(s) 95 can be positioned along plate 55 (e.g., planar to the surface, slightly below the surface, etc.). The viewing angle for an optical sensor implemented for sensor(s) 95 can be, for example, 45 degrees plus-or-minus 15 degrees (i.e., 30 to 60 degrees) and preferably plus-or-minus 5 degrees (i.e., 40 to 50 degrees). Other variations can also be implemented.

In the particular embodiment shown in FIG. 6, the one or more sensors 95 are positioned on a surface of the bake chamber 50, which is removed from, yet within sight of, the bake chamber lid assembly 90 to detect and/or quantify an amount of particulate accumulation that develops over time on the inner surface 90a of the bake chamber lid assembly 90. In particular, sensor(s) 95 are coupled to horizontal shielding plate 55 in FIG. 6. As indicated above, in some embodiments, sensor(s) 95 may be mounted to horizontal shielding plate 55 (or another inside surface of bake chamber 50) at an angle of 30 to 60 degrees and preferably 40-50 degrees. As such, the field of view of the sensor(s) will capture most (if not all) of the inner surface 90a of the bake chamber lid assembly 90. When positioned in such a manner, sensor(s) 95 may be configured to monitor particulate accumulation on the inner surface 90a of the bake chamber lid assembly 90 when the bake chamber lid assembly opens for wafer retrieval (as shown in FIG. 6).

In one example implementation, one or more camera(s) may be used to implement the sensor(s) 95 shown in FIG. 6. In some embodiments, camera(s) 95 may capture digital images (e.g., still pictures or video) of the inner surface 90a of the bake chamber lid assembly 90 (or another inside surface of bake chamber 50), and the digital images may be provided to controller 96 as sensor output. In some embodiments, controller 96 may receive a digital image from camera(s) 95 after each bake process (e.g., when the bake chamber lid assembly 90 opens for wafer retrieval). Alternatively, controller 96 may receive digital images from camera(s) 95 continuously or upon another periodic schedule (e.g., after a predetermined number of bake processes, after a predetermined amount of bake time, etc.).

In another example implementation, one or more optical spectrometer(s) may be used to implement the sensor(s) 95 shown in FIG. 6. In some embodiments, spectrometer(s) 95 may capture spectral information from the inner surface 90a of the bake chamber lid assembly 90 (or another inside surface of bake chamber 50), and the spectral information may be provided to controller 96 as sensor output. In some embodiments, controller 96 may receive spectral information from spectrometer(s) 95 after each bake process (e.g., when the bake chamber lid assembly 90 opens for wafer retrieval). Alternatively, controller 96 may receive spectral information from spectrometer(s) 95 continuously or upon another periodic schedule (e.g., after a predetermined number of bake processes, after a predetermined amount of bake time, etc.).

In the embodiment shown in FIG. 6, controller 96 receives the sensor output from the one or more sensors 95, and uses the sensor output to detect and/or quantify an amount of particulate accumulation deposited or condensed on the inner surface 90a of the bake chamber lid assembly 90 (or another inside surface of bake chamber 50). In some embodiments, controller 96 may process the digital images received from camera(s) 95 to detect a color change on the inner surface 90a of the bake chamber lid assembly 90, and may equate the color change (or the surface area affected by the color change) to an amount of particulate accumulation. In other embodiments, controller may process the spectral information received from spectrometer(s) 95 to detect a spectral change on the inner surface 90a of the bake chamber lid assembly 90, and may equate the spectral change (or the surface area affected by the spectral change) to an amount of particulate accumulation. Controller 96 may then compare the amount of particulate accumulation to a predefined accumulation threshold to determine if the bake chamber lid assembly 90 should be cleaned.

In some embodiments, the predefined accumulation threshold for a camera solution may be determined by reference to light reflecting off the surface. For example, the color the camera detects can be a thin film interference result associated with light reflecting off the surface. Assuming a small spectral range light source is used, then the oscillations that occur from constructive and destructive interference will directly be linked to a wavelength divided-by-2 ($\lambda/2$) relationship of thickness of accumulation. If accumulation threshold is less than one oscillation, then a simple linear relationship can be used between red-blue-green (RGB) greyscale values and thickness of accumulation, or a relationship can be formed directly between RGB greyscale values and particle counts from inspection tools. In other embodiments, the predefined accumulation threshold for a spectrometer solution may be determined by capturing basic thin film interference effects. For example, an accumulation threshold correlation can be found between spectrometer intensity at a given wavelength value and thickness of accumulation. An accumulation threshold correlation can also be found directly between intensity value and particle counts from inspection tools. Alternatively, if optical properties of material accumulation is known, then fitting the change in spectral signature can yield an accurate thickness of accumulation that can be related to defectivity. Other variations can also be implemented.

In the disclosed embodiments, controller 96 may perform one or more actions upon determining that a cleaning cycle is needed for the bake chamber 50 and/or the bake chamber lid assembly 90. For example, controller 96 may signal an alarm, log an event, interrupt a processing step and/or initiate or trigger a cleaning cycle for the bake chamber 50 and/or the bake chamber lid assembly 90. In some embodiments, controller 96 may perform alternative or additional actions upon determining that the bake chamber 50 and/or the bake chamber lid assembly 90 should be cleaned.

It is noted that the controller(s) described herein can be implemented in a wide variety of manners. In one example, the controller 96 shown in FIGS. 5 and 6 may be a computer. In another example, controller 96 may include one or more programmable integrated circuits that are programmed to provide the functionality described herein. For example, one or more processors (e.g., microprocessor, microcontroller, central processing unit, etc.), programmable logic devices (e.g., complex programmable logic device (CPLD)), field programmable gate array (FPGA), etc.), and/or other programmable integrated circuits can be programmed with software or other programming instructions to implement the functionality described herein for controller 96. It is further noted that the software or other programming instructions can be stored in one or more non-transitory computer-readable mediums (e.g., memory storage devices, flash memory, dynamic random access memory (DRAM), reprogrammable storage devices, hard drives, floppy disks, DVDs, CD-ROMs, etc.), and the software or other programming instructions when executed by the programmable integrated circuits cause the programmable integrated circuits to perform the processes, functions, and/or capabilities described herein. Other variations could also be implemented.

The monitoring systems embodiments shown in FIGS. 5 and 6 improve photolithography process flows by enabling predictive maintenance to be performed when necessary (e.g., prior to excessive particulate accumulation), rather than on a conservative preventative maintenance cleaning schedule. In this manner, the monitoring systems disclosed herein may be used to minimize bake process excursions and wafer defects, while maximizing equipment operation efficiency by limiting the amount of maintenance to only what is required.

FIG. 7 illustrates one embodiment of a method that implements the monitoring and control techniques described herein. More specifically, FIG. 7 illustrates one embodiment of a method 100 that may be used to monitor particle accumulation within a bake chamber to determine when the bake chamber requires cleaning. Although not strictly limited to such, the method 100 shown in FIG. 7 may be used within the bake chamber 50 shown in FIGS. 5 and 6. It will be recognized, however, that the embodiments shown in FIG. 7 are merely exemplary and additional methods may utilize the techniques described herein. Further, additional processing steps may be added to the methods shown in the FIG. 7, as the steps described are not intended to be exclusive. Moreover, the order of the steps is not limited to the order shown in FIG. 7 as different orders may occur and/or various steps may be performed in combination or at the same time.

As shown in FIG. 7, method 100 may monitor particulate accumulation on one or more inside surfaces of a bake chamber and/or on a bake chamber lid assembly of the bake chamber (in step 110), and compare the particulate accumulation to a predefined accumulation threshold (in step 120). If the particulate accumulation exceeds the predefined accumulation threshold (YES branch of step 130), method 100 may determine that the bake chamber and/or the bake chamber lid assembly requires cleaning (in step 140). If the particulate accumulation does not exceed the predefined accumulation threshold (NO branch of step 130), method 100 may continue to monitor particulate accumulation (in step 110).

In some embodiments, method 100 may perform one or more actions (in step 150) upon determining that the bake chamber and/or the bake chamber lid assembly requires cleaning (in step 140). For example, the method may signal an alarm, log an event, interrupt a processing step and/or initiate or trigger a cleaning cycle for the bake chamber and/or the bake chamber lid assembly (in step 150). For one additional embodiment, self-cleaning capability is provided. For example, when cleaning is triggered, the chamber is emptied and an ultraviolet (UV) ozone (03) cleaning cycle is initiated to remove the organic materials within the chamber. It is recognized, however, that the one or more actions performed in step 150 are not strictly limited to the example actions noted above. In some embodiments, method 100 may perform alternative or additional actions (in step 150) upon determining that the bake chamber and/or the bake chamber lid assembly requires cleaning (in step 140).

In some embodiments, method 100 may monitor particulate accumulation (in step 110) by detecting or calculating a mass variation per unit area on a surface of a quartz crystal resonator of a QCM sensor, which is incorporated within the bake chamber and/or the bake chamber lid assembly. In such embodiments, method 100 may compare the mass variation per unit area to a predefined mass threshold (in step 120) and determine that the bake chamber and/or the bake chamber lid assembly requires cleaning (in step 140) if the mass variation per unit area exceeds the predefined mass threshold (YES branch of step 130).

In other embodiments, method 100 may monitor particulate accumulation (in step 110) by capturing digital images of one or more inside surfaces of the bake chamber and/or the bake chamber lid assembly, processing the digital images to detect a color change on the one or more inside surfaces, and equating the color change (or a surface area affected by the color change) to an amount of particulate accumulation. In such embodiments, method 100 may compare the amount of particulate accumulation to a predefined accumulation threshold (in step 120) and determine that the bake chamber and/or the bake chamber lid assembly requires cleaning (in step 140) if the amount of particulate accumulation exceeds the predefined accumulation threshold (YES branch of step 130).

In yet other embodiments, method 100 may monitor particulate accumulation (in step 110) by capturing spectral information from one or more inside surfaces of the bake chamber and/or the bake chamber lid assembly, processing the spectral information to detect a spectral change on the one or more inside surfaces, and equating the spectral change (or a surface area affected by the spectral change) to an amount of particulate accumulation. In such embodiments, method 100 may compare the amount of particulate accumulation to a predefined accumulation threshold (in step 120) and determine that the bake chamber and/or the bake chamber lid assembly requires cleaning (in step 140) if the amount of particulate accumulation exceeds the predefined accumulation threshold (YES branch of step 130).

It will be recognized that the method embodiments disclosed herein may be utilized before, during or after a wide range of substrates have been thermally treated or baked in a bake chamber. The substrate may be any substrate for which the patterning of the substrate is desirable. For example, in one embodiment, the substrate may be a semiconductor substrate having one or more semiconductor processing layers (all of which together may comprise the substrate) formed thereon. Thus, in one embodiment, the substrate may be a semiconductor substrate that has been subject to multiple semiconductor processing steps that yield a wide variety of structures and layers, all of which are known in the substrate processing art, and which may be considered to be part of the substrate. For example, in one embodiment, the substrate may be a semiconductor wafer having one or more semiconductor processing layers formed thereon. Although the concepts disclosed herein may be utilized at any stage of the substrate process flow, the monitoring and control techniques described herein may generally be performed before, during or after the substrate is subject to a bake process to cure or harden a film deposited or applied onto the substrate.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Microelectronic workpiece" as used herein generically refers to the object being processed in accordance with the invention. The microelectronic workpiece may include any material portion or structure of a device, particularly a semiconductor or other electronics device, and may, for example, be a base substrate structure, such as a semiconductor substrate or a layer on or overlying a base substrate structure such as a thin film. Thus, workpiece is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOT") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Systems and methods for processing a microelectronic workpiece are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method to monitor particulate accumulation within a bake chamber configured to thermally treat substrates and to determine when the bake chamber requires cleaning, the method comprising:
    monitoring particulate accumulation on an inside surface of the bake chamber and/or on a bake chamber lid assembly of the bake chamber;
    comparing the particulate accumulation to a predefined accumulation threshold; and
    indicating that the bake chamber and/or the bake chamber lid assembly requires cleaning if the particulate accumulation exceeds the predefined accumulation threshold.

2. The method of claim 1, wherein the monitoring comprises detecting or calculating a mass variation per unit area on a surface of a quartz crystal resonator incorporated within the bake chamber and/or the bake chamber lid assembly.

3. The method of claim 2, wherein the comparing comprises comparing the mass variation per unit area to a predefined mass threshold.

4. The method of claim 3, further comprising determining that the bake chamber and/or the bake chamber lid assembly requires cleaning if the mass variation per unit area exceeds the predefined mass threshold.

5. The method of claim 1, wherein the monitoring comprises:
    capturing digital images of the inside surface of the bake chamber and/or the bake chamber lid assembly;
    processing the digital images to detect a color change; and
    equating the color change, or a surface area affected by the color change, to an amount of particulate accumulation.

6. The method of claim 5, wherein the comparing comprises comparing the amount of particulate accumulation to the predefined accumulation threshold.

7. The method of claim 6, further comprising determining that the bake chamber and/or the bake chamber lid assembly requires cleaning if the amount of particulate accumulation exceeds the predefined accumulation threshold.

8. The method of claim 1, wherein the monitoring comprises:
    capturing spectral information from the inside surface of the bake chamber and/or the bake chamber lid assembly;
    processing the spectral information to detect a spectral change; and
    equating the spectral change, or a surface area affected by the spectral change, to an amount of particulate accumulation.

9. The method of claim 8, wherein the comparing comprises comparing the amount of particulate accumulation to the predefined accumulation threshold.

10. The method of claim 9, further comprising determining that the bake chamber and/or the bake chamber lid assembly requires cleaning if the amount of particulate accumulation exceeds the predefined accumulation threshold.

11. The method of claim 1, further comprising performing one or more actions based upon when the bake chamber and/or the bake chamber lid assembly requires cleaning, and wherein the one or more actions comprise at least one of signaling an alarm, logging an event, interrupting a processing step, or initiating a cleaning cycle.

12. A system, comprising:
    a bake chamber configured to perform a bake process for a substrate, wherein the bake chamber comprises:
        a processing chamber;
        a bake plate disposed within the processing chamber and configured to thermally treat a substrate mounted onto the bake plate; and
        a bake chamber lid assembly forming a portion of the processing chamber;
    one or more sensors configured to monitor particulate accumulation on an inside surface of the bake chamber and/or the bake chamber lid assembly; and
    a controller coupled to the one or more sensors and configured to determine if the bake chamber and/or the bake chamber lid assembly requires cleaning.

13. The system of claim 12, wherein the one or more sensors are positioned within or on an inner surface of the bake chamber lid assembly.

14. The system of claim 13, wherein the one or more sensors comprise at least one quartz crystal microbalance (QCM) sensor, which is configured to monitor particulate accumulation on the inner surface of the bake chamber lid assembly by detecting a mass variation per unit area on a surface of a quartz crystal resonator of the QCM sensor.

15. The system of claim 14, wherein the controller is configured to:
    compare the mass variation per unit area to a predefined mass threshold; and
    determine that the bake chamber lid assembly requires cleaning if the mass variation per unit area exceeds the predefined mass threshold.

16. The system of claim 12, wherein the one or more sensors are positioned on an inside surface of the bake chamber or an outside surface of the bake chamber.

17. The system of claim 16, wherein the one or more sensors comprise at least one camera, which is configured to monitor particulate accumulation on the inside surface of the bake chamber and/or the bake chamber lid assembly by capturing digital images of the inside surface of the bake chamber and/or the bake chamber lid assembly.

18. The system of claim 17, wherein the controller is configured to:
- process the digital images captured by the at least one camera to detect a color change on the inside surface;
- equate the color change, or a surface area affected by the color change, to an amount of particulate accumulation;
- compare the amount of particulate accumulation to a predefined accumulation threshold; and
- determine that the bake chamber and/or the bake chamber lid assembly requires cleaning if the amount of particulate accumulation exceeds the predefined accumulation threshold.

19. The system of claim 16, wherein the one or more sensors comprise at least one spectrometer, which is configured to monitor particulate accumulation on the inside surface of the bake chamber and/or the bake chamber lid assembly by capturing spectral information from the inside surface of the bake chamber and/or the bake chamber lid assembly.

20. The system of claim 19, wherein the controller is configured to:
- process the spectral information captured by the at least one spectrometer to detect a spectral change on the inside surface;
- equate the spectral change, or a surface area affected by the spectral change, to an amount of particulate accumulation;
- compare the amount of particulate accumulation to a predefined accumulation threshold; and
- determine that the bake chamber and/or the bake chamber lid assembly requires cleaning if the amount of particulate accumulation exceeds the predefined accumulation threshold.

* * * * *